(12) United States Patent
Sills et al.

(10) Patent No.: US 10,847,512 B2
(45) Date of Patent: Nov. 24, 2020

(54) DEVICES, MEMORY DEVICES, AND ELECTRONIC SYSTEMS

(71) Applicant: Micron Technology, Inc., Boise, ID (US)

(72) Inventors: Scott E. Sills, Boise, ID (US); Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/748,269

(22) Filed: Jan. 21, 2020

(65) Prior Publication Data

US 2020/0161295 A1 May 21, 2020

Related U.S. Application Data

(63) Continuation of application No. 15/966,197, filed on Apr. 30, 2018, now Pat. No. 10,586,795.

(51) Int. Cl.
| | | |
|---|---|---|
| *G11C 5/06* | (2006.01) | |
| *H01L 27/06* | (2006.01) | |
| *G11C 7/06* | (2006.01) | |
| *G11C 7/10* | (2006.01) | |
| *G11C 7/12* | (2006.01) | |
| *G11C 8/08* | (2006.01) | |

(Continued)

(52) U.S. Cl.
CPC ............ *H01L 27/0688* (2013.01); *G11C 7/06* (2013.01); *G11C 7/1069* (2013.01); *G11C 7/1078* (2013.01); *G11C 7/12* (2013.01); *G11C 8/08* (2013.01); *G11C 8/10* (2013.01); *G11C 29/44* (2013.01); *H01L 21/8221* (2013.01); *H01L 23/528* (2013.01); *H01L 27/124* (2013.01)

(58) Field of Classification Search
CPC ....... G11C 5/063; G11C 7/18; G11C 11/4097; G11C 5/025; G11C 5/04
USPC ...................................................... 365/51, 63
See application file for complete search history.

(56) References Cited

U.S. PATENT DOCUMENTS

| | | |
|---|---|---|
| 4,740,826 A | 4/1988 | Chatterjee |
| 5,038,325 A | 8/1991 | Douglas et al. |

(Continued)

FOREIGN PATENT DOCUMENTS

WO 2008/063251 A2 5/2008

OTHER PUBLICATIONS

Bonnaud et al., Vertical Channel Thin Film Transistor: Improvement Approach Similar to Multigate Monlithic CMOS Technology, ECS Transactions, vol. 37, No. 1, (2011), pp. 29-37.

(Continued)

*Primary Examiner* — Son T Dinh
(74) *Attorney, Agent, or Firm* — TraskBritt

(57) ABSTRACT

A semiconductor device comprises a stack structure comprising decks each comprising a memory level comprising memory elements, a control logic level vertically adjacent and in electrical communication with the memory level and comprising control logic devices configured to effectuate a portion of control operations for the memory level, and an additional control logic level vertically adjacent and in electrical communication with the memory level and comprising additional control logic devices configured to effectuate an additional portion of the control operations for the memory level. A memory device, a method of operating a semiconductor device, and an electronic system are also described.

19 Claims, 7 Drawing Sheets

(51) Int. Cl.
*G11C 8/10* (2006.01)
*G11C 29/44* (2006.01)
*H01L 21/822* (2006.01)
*H01L 23/528* (2006.01)
*H01L 27/12* (2006.01)

(56) References Cited

U.S. PATENT DOCUMENTS

| | | | |
|---|---|---|---|
| 5,521,860 | A | 5/1996 | Ohkubo |
| 6,094,068 | A | 7/2000 | Nomura et al. |
| 6,349,399 | B1 | 2/2002 | Manning |
| 6,691,252 | B2 | 2/2004 | Hughes et al. |
| 6,924,560 | B2 | 8/2005 | Wang et al. |
| 7,265,393 | B2 | 9/2007 | Schuele et al. |
| 7,372,091 | B2 | 5/2008 | Leslie |
| 7,408,224 | B2 | 8/2008 | Kim |
| 7,825,460 | B2 | 11/2010 | Breitwisch et al. |
| 8,294,212 | B2 | 10/2012 | Wang et al. |
| 8,958,228 | B2 | 2/2015 | Samachisa et al. |
| 9,105,320 | B2 | 8/2015 | Schubert et al. |
| 9,281,044 | B2 | 3/2016 | Ramaswamy et al. |
| 9,405,468 | B2 | 8/2016 | Bringivijayaraghavan et al. |
| 9,405,568 | B2 | 8/2016 | Garg et al. |
| 9,432,298 | B1 | 8/2016 | Smith |
| 9,530,790 | B1 | 12/2016 | Lu et al. |
| 9,653,617 | B2 | 5/2017 | Zhou et al. |
| 10,586,795 | B1 * | 3/2020 | Sills ................ G11C 5/025 |
| 2001/0054576 | A1 | 12/2001 | Stardust et al. |
| 2006/0049461 | A1 | 3/2006 | Schuele et al. |
| 2006/0076690 | A1 | 4/2006 | Khandros et al. |
| 2006/0081887 | A1 * | 4/2006 | Lyu ................ H01L 27/14603 257/215 |
| 2006/0097304 | A1 | 5/2006 | Yoon et al. |
| 2009/0168482 | A1 | 7/2009 | Park et al. |
| 2013/0075740 | A1 | 3/2013 | Correia et al. |
| 2014/0151776 | A1 | 6/2014 | Beigel et al. |
| 2014/0361239 | A1 | 12/2014 | Ramaswamy et al. |
| 2016/0104715 | A1 | 4/2016 | Pachamuthu et al. |
| 2016/0240533 | A1 | 8/2016 | Oxland |
| 2016/0343727 | A1 | 11/2016 | Kim et al. |

OTHER PUBLICATIONS

Chan et al., 100-nm Channel Length a-Si:H Vertical Thin Film Transistors, Mat. Res. Soc. Symp. Proc. vol. 814, (2004), 10 pages.
Chan et al., Amorphous Silicon Thin-Film Transistors with 90° Vertical Nanoscale Channel, App. Phys. Lett., vol. 86, (2005), pp. 253501-1-253501-3.
Fairchild Semiconductor, CMOS, the Ideal Logic Family, AN-77, (1998), www.fairchildsemi.com.
International Search Report from International Application No. PCT/US2019/028067, dated Aug. 7, 2019, 7 pages.
International Written Opinion from International Application No. PCT/US2019/028067, dated Aug. 7, 2019, 7 pages.
ITRS, International Technology Roadmap for Semiconductors 2013 Edition, Process Integration, Devices, and Structures, 51 pages.
Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.
Michal, Vratislav, On the Low-Power Design, Stability Improvement and Frequency Estimation of the CMOS Ring Oscillator, Radioelektronika, 2012 22nd International Conference, (Apr. 17-18, 2012), 4 pages.
Nelson et al., Defeating the Trade-Off Between Process Complexity and Electrical Performance with Vertical Zinc Oxide Transistors, Appl. Phys. Lett., vol. 101, (2012), pp. 183503-1-183503-4.
Taiwanese Office Action and Search Report from Taiwanese Application No. 108114632, dated Nov. 4, 2019, 20 pages.
Yakimets et al., Verical GAAFETs for the Ultimate CMOS Scaling, IEEE Transations on Electron Devices, vol. 62, No. 5, (May 2015), pp. 1433-1439.
Zhao et al., Three-Dimensional Flexible Complementary Metal-Oxide-Semiconductor Logic Circuits Based on Two-Layer Stacks of Single Walled Carbon Nanotube Networks, ACS Nano, vol. 10, (2016), pp. 2193-2202.

* cited by examiner

DEVICES, MEMORY DEVICES, AND ELECTRONIC SYSTEMS

CROSS-REFERENCE TO RELATED APPLICATION

This application is a continuation of U.S. patent application Ser. No. 15/966,197, filed Apr. 30, 2018, now U.S. Pat. No. 10,586,795, issued Mar. 10, 2020, the disclosure of which is hereby incorporated herein in its entirety by this reference.

TECHNICAL FIELD

Embodiments of the disclosure relate to the field of semiconductor device design and fabrication. More specifically, embodiments of the present disclosure relate to semiconductor devices including stack structures comprising decks having memory levels operatively associated with control logic levels and additional control logic levels, and to related memory devices, electronic systems, and methods.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor, Modern applications for semiconductor devices can employ significant quantities of memory cells, arranged in memory arrays exhibiting rows and columns of the memory cells. The memory cells may be electrically accessed through digit lines (e.g., bit lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) on the memory cells of the memory device. An assembly of the control logic devices may be provided in electrical communication with the memory cells of the memory array by way of routing and interconnect structures. However, as the number of decks of a 3D memory array increases, electrically connecting the memory cells of the different decks of the 3D memory array to the assembly of control logic devices within the base control logic structure can create sizing and spacing complications associated with the increased quantities and dimensions of routing and interconnect structures required to facilitate the electrical connection. In addition, the quantities, dimensions, and arrangements of the different control logic devices employed within the base control logic structure can also undesirably impede reductions to the size of a memory device, increases to the storage density of the memory device, and/or reductions in fabrication costs.

It would, therefore, be desirable to have improved semiconductor devices, control logic assemblies, and control logic devices facilitating higher packing densities, as well as methods of forming the semiconductor devices, control logic assemblies, and control logic devices.

DETAILED DESCRIPTION

Figure 1A:
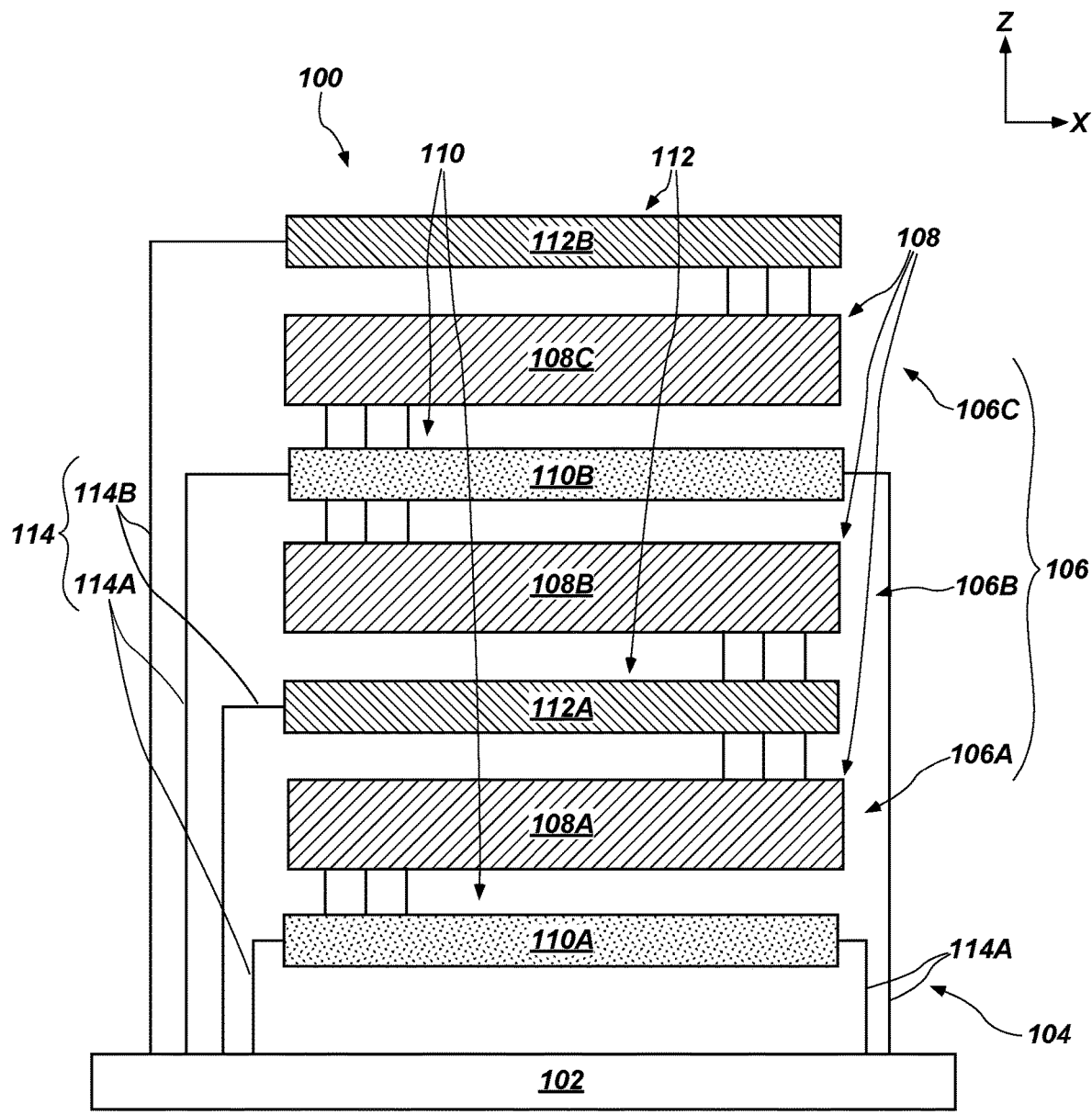
FIGS. 1A and 1B are simplified side elevation (FIG. 1A) and plan (FIG. 1B) views of a semiconductor device, in accordance with embodiments of the disclosure.

Semiconductor devices including stack structures comprising decks including memory levels operatively associated with control logic levels and additional control logic levels are described, as are memory devices, electronic systems, and methods of operating semiconductor devices. In some embodiments, a semiconductor device includes a stack structure including multiple decks (e.g., tiers) each deck individually including a memory level located vertically between a control logic level and an additional control logic level. The control logic level and the additional control logic level may be configured and operable to control different operations of the memory level than one another, such as different column and row operations for an array of memory elements of the memory level. Accordingly, control logic devices and circuity included in the control logic level may be at least partially different than control logic devices and circuitry included in the additional control logic level. The control logic level and/or the additional control logic level may also be shared between the memory level and one or more additional memory levels vertically neighboring the memory level. For example, the control logic level may be shared between the memory level and an additional memory level vertically neighboring the memory level, such that the control logic level effectuates the same control operations (e.g., column-based operations) within the memory level and the additional memory level. As another example, the additional control logic level may be shared between the memory level and another memory level vertically neighboring the memory level, such that the control logic level effectuates the same control operations (e.g., row-based operations) within the memory level and the another memory level. The control logic devices included in the control logic level and the additional control logic level associated with at least one deck of the stack structure may include at least one device including transistors (e.g., vertical transistors, horizontal transistors, fin field-effect transistors (FinFETs)) laterally (e.g., horizontally) displaced (e.g., spaced apart, separated) from one another, and/or may include at least one device including transistors (e.g., vertical transistors, horizontal transistors) longitudinally (e.g., vertically) displaced from one another. In addition, the control logic level and the additional control logic level associated with each deck of the stack structure may be in electrical communication with a base control logic structure of the semiconductor device. The base control logic structure may include different control logic devices and circuity than those included in the control logic levels and the additional control logic levels of the stack structure. The additional control logic devices and circuity included in the base control logic structure work in conjunction with the control logic devices and circuity included in the control logic level and the additional control logic level associated with each of the decks of the stack structure to facilitate desired operations (e.g., access operations, read operations, write operations) of the semiconductor device. The devices, structures, assemblies, and methods of the disclosure may facilitate increased efficiency, performance, simplicity, and durability in semiconductor devices (e.g., 3D memory devices) that rely on high packing density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically neighboring" or "longitudinally neighboring" features (e.g., structures, levels, decks, devices) means and includes features located most vertically proximate (e.g., vertically closest) one another. In addition, as used herein, "horizontally neighboring" or "laterally neighboring" features (e.g., structures, levels, decks, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "NMOS" transistor means and includes a so-called metal-oxide transistor having a P-type channel region. The gate of the NMOS transistor may comprise a conductive metal, another conductive material, such as polysilicon, or a combination thereof. As used herein, the term "PMOS" transistor means and includes a so-called metal-oxide transistor having an N-type channel region. The gate of the PMOS transistor may comprise a conductive metal, another conductive material, such as polysilicon, or a combination thereof. Accordingly, the gate structures of such transistors may include conductive materials that are not necessarily metals.

FIG. 1A shows a simplified side elevation view of a semiconductor device 100 (e.g., a 3D memory device), in accordance with embodiments of the disclosure. As shown in FIG. 1A, the semiconductor device 100 includes a base control logic structure 102, and a stack structure 104 overlying the base control logic structure 102. As described in further detail below, the stack structure 104 includes multiple decks, for example decks 106A-106C (e.g., tiers) including memory levels 108, control logic levels 110 (e.g., thin film transistor (TFT) control logic levels), and additional control logic levels 112 (e.g., additional TFT control logic levels). Each of the decks 106A-106C may include one of the memory levels 108 positioned vertically (e.g., longitudinally) between one of the control logic levels 110 and one of the additional control logic levels 112. The control logic levels 110 and the additional control logic levels 112 may exhibit different configurations (e.g., different control logic devices, different assemblies of control logic devices) than one another, and may be configured and operated to perform different control functions for the semiconductor device 100 than one another, as also described in further detail below. At shown in FIG. 1A, one or more of the control logic levels 110 may be shared by vertically neighboring memory levels 108 of the stack structure 104 structure, such that various control operations (e.g., control operations for columns of memory elements) for two (2) vertically neighboring memory levels 108 can be effectuated by a single (e.g., only one) control logic level 110 vertically therebetween. In addition, as also shown in FIG. 1A, one or more of the additional control logic levels 112 may be shared by vertically neighboring memory levels 108 of the stack structure 104 structure, such that various control operations (e.g., control operations for rows of memory elements) for two (2) vertically neighboring memory levels 108 can be effectuated by a single (e.g., only one) additional control logic level 112 vertically therebetween. The base control logic structure 102 of a semiconductor device 100 may be in electrical communication with one or more (e.g., each) of the decks 106 of the stack structure 104 by way of interconnect structures 114 extending between the base control logic structure 102 and each of the control logic levels 110 and the additional control logic levels 112 of the stack structure 104. In addition, the memory levels 108 of the stack structure 104 may be in electrical communication with the control logic levels 110 and the additional control logic levels 112 vertically adjacent thereto by way of additional interconnect structures.

The base control logic structure 102 may include devices and circuitry for controlling various operations of the stack structure 104. The devices and circuitry included in the base control logic structure 102 may be selected relative to devices and circuitry included in the control logic levels 110 and the additional control logic levels 112 of the stack structure 104. The devices and circuitry included in the base control logic structure 102 may be different than the devices and circuitry included in the control logic levels 110 and the additional control logic levels 112 of the stack structure 104, and may be used and shared by different decks 106 of the stack structure 104 to facilitate desired operation of the stack structure 104. By way of non-limiting example, the base control logic structure 102 may include one or more (e.g., each) of charge pumps (e.g., VCCP charge pumps, VNEGWL charge pumps, DVC2 charge pumps), delay-locked loop (DLL) circuitry (e.g., ring oscillators), drain supply voltage ($V_{dd}$) regulators, and various chip/deck control circuitry. The devices and circuitry included in the base control logic structure 102 may employ different conventional control logic devices (e.g., different conventions CMOS devices, such as conventional CMOS inverters, conventional CMOS NAND gates, conventional CMOS transmission pass gates), which are not described in detail herein. In turn, as described in further detail below, at least some of the devices and circuitry included in the control logic levels 110 and the additional control logic levels 112 of the stack structure 104 may also be shared by different (e.g., vertically neighboring) decks 106 of the stack structure 104, and may be dedicated to effectuating and controlling various operations (e.g., memory level operations) of the decks 106 (e.g., vertically neighboring decks 106) associated therewith not encompassed within the functions of the devices and circuitry included in the base control logic structure 102.

As shown in FIG. 1A, the interconnect structures 114 of the semiconductor device 100 may include first interconnect structures 114A and second interconnect structures 114B. The first interconnect structures 114A may extend between and electrically couple the base control logic structure 102 and the control logic levels 110 (e.g., the first control logic level 110A and the second control logic level 110B) of the stack structure 104. The second interconnect structures 114B may extend between and electrically couple the base control logic structure 102 and the additional control logic levels 112 (e.g., the first additional control logic level 112A and the second additional control logic level 112B) of the stack structure 104. At least some (e.g., each) of the first interconnect structures 114A may be disposed within a different lateral region (e.g., a different lateral area) across the semiconductor device 100 than at least some (e.g., each) of the second interconnect structures 114B. The first interconnect structures 114A may, for example, be disposed within a first socket area proximate (e.g., adjacent) a first lateral boundary of the stack structure 104; and the second interconnect structures 114B may, for example, be disposed within a second, different socket area proximate (e.g., adjacent) a second, different lateral boundary of the stack structure 104.

Figure 1B:
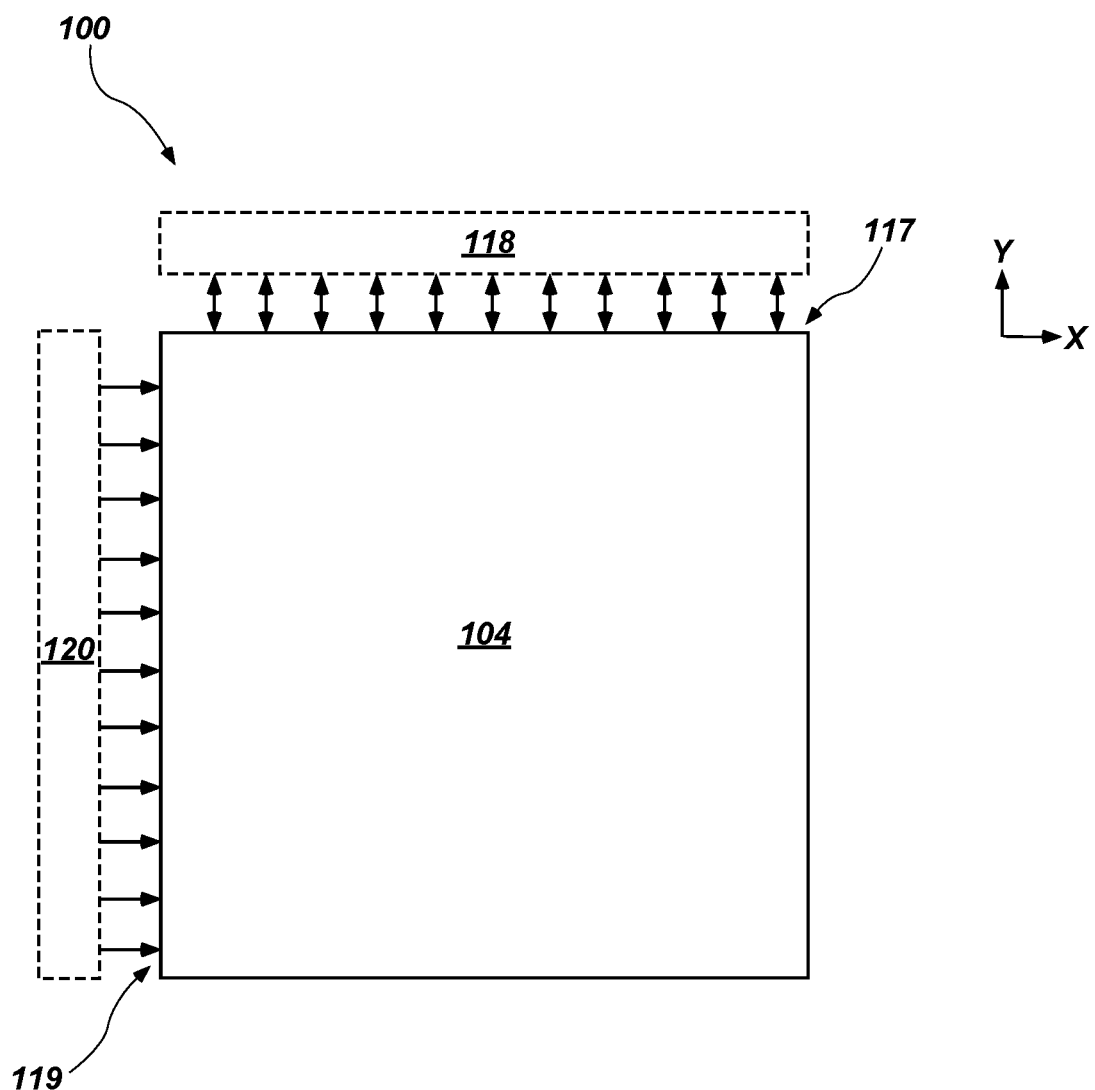

By way of non-limiting example, FIG. 1B shows a plan view of the semiconductor device 100 shown in FIG. 1A, including different socket areas for connecting the base control logic structure 102 (FIG. 1A) to the control logic levels 110 (FIG. 1A) and the additional control logic levels 112 (FIG. 1A) of the stack structure 104. As shown in FIG. 1B, a first socket area 118 may be positioned proximate (e.g., adjacent) and extend in substantially the same lateral direction (e.g., the X-direction) as a first lateral boundary 117 of the stack structure 104, and a second socket area 120 may be positioned proximate (e.g., adjacent) and extend in substantially the same lateral direction (e.g., the X-direction) as a second lateral boundary 119 of the stack structure 104. The first socket area 118 may, for example, laterally contain the first interconnect structures 114A (FIG. 1A) extending from the base control logic structure 102 (FIG. 1A) to the control logic levels 110 (FIG. 1A) of the stack structure 104; and the second socket area 120 may, for example, laterally contain the second interconnect structures 114B (FIG. 1A) extending from the base control logic structure 102 (FIG. 1A) to the additional control logic levels 112 (FIG. 1A) of the stack structure 104. In additional embodiments, the first socket area 118 may laterally contain the second interconnect structures 114B (FIG. 1A) extending from the base control logic structure 102 (FIG. 1A) to the additional control logic levels 112 (FIG. 1A) of the stack structure 104; and the second socket area 120 may laterally contain the first interconnect structures 114A (FIG. 1A) extending from the base control logic structure 102 (FIG. 1A) to the control logic levels 110 (FIG. 1A) of the stack structure 104.

With returned reference to FIG. 1A, the stack structure 104 may include any desired number of the decks 106. For clarity and ease of understanding of the drawings and related description, FIG. 1A shows the stack structure 104 as including three (3) decks 106. A first deck 106A of the stack structure 104 may include a first memory level 108A, a first control logic level 110A, and a first additional control logic level 112A. The first memory level 108A of the first deck 106A may be electrically coupled to and vertically intervene between the first control logic level 110A and the first additional control logic level 112A. A second deck 106B of the stack structure 104 may vertically overlie the first deck 106A of the stack structure 104, and may include the first additional control logic level 112A, a second memory level 108B, and a second additional control logic level 112B. The first additional control logic level 112A may be shared by the first memory level 108A of the first deck 106A and the second memory level 108B of the second deck 106B. The second memory level 108B of the second deck 106B may be electrically coupled to and vertically intervene between the first additional control logic level 112A and the second control logic level 110B. A third deck 106C of the stack structure 104 may vertically overlie the second deck 106B of the stack structure 104, and may include the second control logic level 110B, a third memory level 108C, and a second additional control logic level 112B. The second control logic level 110B may be shared by the second memory level 108B of the second deck 106B and the third memory level 108C of the third deck 106C. The third memory level 108C of the third deck 106C may be electrically coupled to and vertically intervene between the second control logic level 110B and the second additional control logic level 112B. In additional embodiments, the stack structure 104 includes a different number of decks 106. For example, the stack structure 104 may include greater than three (3) decks 106 (e.g., greater than or equal to four (4) decks 106, greater than or equal to eight (8) decks 106, greater than or equal to sixteen (16) decks 106, greater than or equal to thirty-two (32) decks 106, greater than or equal to sixty-four (64) decks 106), or may include less than three (3) decks 106 (e.g., two (2) decks 106).

The memory levels 108 (e.g., the first memory level 108A, the second memory level 108B, the third memory level 108C) of the decks 106 (e.g., the first deck 106A, the second deck 106B, the third deck 106C) of the stack structure 104 may each individually include a memory element array and an access device array. For a given memory level 108 (e.g., the first memory level 108A, the second memory level 108B, or the third memory level 108C), access devices of the access device array may underlie (or overlie) and be in electrical communication with memory elements of the memory element array. Together the access devices and the memory elements of a given memory level 108 may form memory cells for each of the decks 106 of the stack structure 104.

The memory element array of each of the memory levels 108 may, for example, include rows of memory elements extending in a first lateral direction, and columns of memory elements extending in a second lateral direction perpendicular to the first lateral direction. In additional embodiments, the array may include a different arrangement of memory elements, such as a hexagonal close packed arrangement of memory elements. The memory elements of the memory element array may comprise RAM elements, ROM elements, DRAM elements, SDRAM elements, Flash memory elements, resistance variable memory elements, or another type of memory element. In some embodiments, the memory elements comprise DRAM elements. In additional embodiments, the memory elements comprise resistance variable memory elements. Non-limiting examples of resistance variable memory elements include ReRAM elements, conductive bridge RAM elements, MRAM elements, PCM memory elements, PCRAM elements, STTRAM elements, oxygen vacancy-based memory elements, and programmable conductor memory elements.

The quantity and lateral positioning of access devices of the access device array of each of the memory levels 108 may, for example, correspond to the quantity and lateral positioning of memory elements of the memory element array of the given memory level. The access devices may, for example, each individually include a channel region between a pair of source/drain regions, and a gate configured to electrically connect the source/drain regions to one another through the channel region. The access devices may comprise planar access devices (e.g., planar ITT access devices; planar diode devices, such as planar two-terminal diode devices; planar threshold switching devices) or vertical access devices (e.g., vertical TFT access devices; vertical diode devices, such as vertical two-terminal diode devices; vertical threshold switching devices). Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base (e.g., the base control logic structure 102) thereunder, and current flow between source and drain regions of a planar access device is primarily parallel to the primary surface of the substrate or base thereunder.

The control logic levels 110 may comprise TFT control logic levels each individually including one or more field-effect transistors including films of active semiconductor materials, dielectric materials, and metallic contacts. The control logic levels 110 (e.g., the first control logic level 110A, the second control logic level 110B) employed by the decks 106 (e.g., the first deck 106A, the second deck 106B, the third deck 106C) of the stack structure 104 may include devices and circuitry for controlling various operations of the memory levels 108 (e.g., the first memory level 108A, the second memory level 108B, the third memory level 108C) of the decks 106 not encompassed (e.g., effectuated, carried out, covered) by the devices and circuitry of the base control logic structure 102 and the additional control logic levels 112. As a non-limiting example, the control logic levels 110 may each individually include devices and circuitry for controlling column operations for arrays (e.g., memory element array(s), access device array(s)) of the memory level(s) 108 operatively associated therewith, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As another non-limiting example, the control logic levels 110 may each individually include devices and circuitry for controlling row operations for arrays (e.g., memory element array(s), access device array(s)) of the memory level(s) 108 operatively associated therewith, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices. As described in further detail below, the devices and circuitry included in the control logic levels 110 may employ control devices, such as TFT complementary metal-oxide-semiconductor (CMOS) devices, including one or more of laterally displaced transistors (e.g., laterally displaced NMOS and PMOS transistors) and vertically displaced transistors (e.g., vertically displaced NMOS and PMOS transistors).

The devices and circuitry of a given control logic level 110 may only be utilized to effectuate and control operations within a single (e.g., only one) deck 106 of the stack structure 104 (e.g., may not be shared between two or more of the decks 106), or may be utilized to effectuate and control operations within multiple (e.g., more than one) decks 106 of the stack structure 104 (e.g., may be shared between two or more of the decks 106). For example, as shown in FIG. 1A, the first control logic level 110A may only control operations within the first deck 106A (e.g., column operations for arrays within the first memory level 108A) of the stack structure 104, and the second control logic level 110B may control operations within each of the second deck 106B and the third deck 106C (e.g., column operations for arrays within each of the second memory level 108B and the third memory level 108C) of the stack structure 104. In addition, each of the control logic levels 110 (e.g., the first control logic level 110A, the second control logic level 110B) of the stack structure 104 may exhibit substantially the same configuration (e.g., substantially the same components and component arrangements), or at least one of the control logic levels 110 of the stack structure 104 may exhibit a different configuration (e.g., different components and/or a different component arrangement) than at least one other of the control logic levels 110.

The additional control logic levels 112 may comprise additional TFT control logic levels each individually including one or more field-effect transistors including films of active semiconductor materials, dielectric materials, and metallic contacts. The additional control logic levels 112 (e.g., the first additional control logic level 112A, the second additional control logic level 112B) employed by the decks 106 (e.g., the first deck 106A, the second deck 106B, the third deck 106C) of the stack structure 104 may include devices and circuitry for controlling various operations of the memory levels 108 (e.g., the first memory level 108A, the second memory level 108B, the third memory level 108C) of the decks 106 not encompassed (e.g., effectuated, carried out, covered) by the devices and circuitry of the base control logic structure 102 and the control logic levels 110. As a non-limiting example, the additional control logic levels 112 may each individually include devices and circuitry for controlling row operations for arrays (e.g., memory element array(s), access device array(s)) of the memory level(s) 108 operatively associated therewith, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices. As another non-limiting example, the additional control logic levels 112 may each individually include devices and circuitry for controlling column operations for arrays (e.g., memory element array(s), access device array(s)) of the memory level(s) 108 operatively associated therewith, such as one or more (e.g., each) of decoders (e.g., local deck decoders, column decoders), sense amplifiers (e.g., EQ amplifiers, ISO amplifiers, NSAs, PSAs, repair circuitry (e.g., column repair circuitry), I/O devices (e.g., local I/O devices), memory test devices, MUX, and ECC devices. As described in further detail below, the devices and circuitry included in the additional control logic levels 112 may employ control devices, such as TFT CMOS devices, including one or more of laterally displaced transistors (e.g., laterally displaced NMOS and PMOS transistors) and vertically displaced transistors (e.g., vertically displaced NMOS and PMOS transistors).

The devices and circuitry of a given additional control logic level 112 may only be utilized to effectuate and control operations within a single (e.g., only one) deck 106 of the stack structure 104 (e.g., may not be shared between two or more of the decks 106), or may be utilized to effectuate and control operations within multiple (e.g., more than one) decks 106 of the stack structure 104 (e.g., may be shared between two or more of the decks 106). For example, as shown in FIG. 1A, the first additional control logic level 112A may control operations within each of the first deck 106A and the second deck 106B (e.g., row operations for arrays within each of the first memory level 108A and the second memory level 108B) of the stack structure 104, and the second additional control logic level 112B may only control operations within the third deck 106C (e.g., row operations for arrays within the third memory level 108C) of the stack structure 104. In addition, each of the additional control logic levels 112 (e.g., the first additional control logic level 112A, the second additional control logic level 112B) of the stack structure 104 may exhibit substantially the same configuration (e.g., substantially the same components and component arrangements), or at least one of the additional control logic levels 112 of the stack structure 104 may exhibit a different configuration (e.g., different components and/or a different component arrangement) than at least one other of the additional control logic levels 112.

An entirety of the control operations for the memory levels 108 (e.g., the first memory level 108A, the second memory level 108B, the third memory level 108C) of the decks 106 (e.g., the first deck 106A, the second deck 106B, the third deck 106C) of the stack structure 104 may be effectuated by the combination of the differentiated control operations and control devices of the base control logic structure 102, the control logic levels 110, and the additional control logic levels 112. Put another way, none of (e.g., not one of) the base control logic structure 102, the control logic levels 110, and the additional control logic levels 112 may exclusively (e.g., by itself alone) facilitate (e.g., provide, effectuate) all of the control operations for a given memory level 108, but the combination of the base control logic structure 102, a given control logic level 110, and a given additional control logic level 112 may facilitate all of the control operations for the given memory level 108. By way of non-limiting example, the combination of the base control logic structure 102, the first control logic level 110A, and the first additional control logic level 112A may facilitate the complete control of the first memory level 108A of the first deck 106A of the stack structure 104; the combination of the base control logic structure 102, the first additional control logic level 112A, and the second control logic level 110B may facilitate the complete control of the second memory level 108B of the second deck 106B of the stack structure 104; and the combination of the base control logic structure 102, the second control logic level 110B, and the second additional control logic level 112B may facilitate the complete control of the third memory level 108C of the third deck 106C of the stack structure 104.

Figure 2:
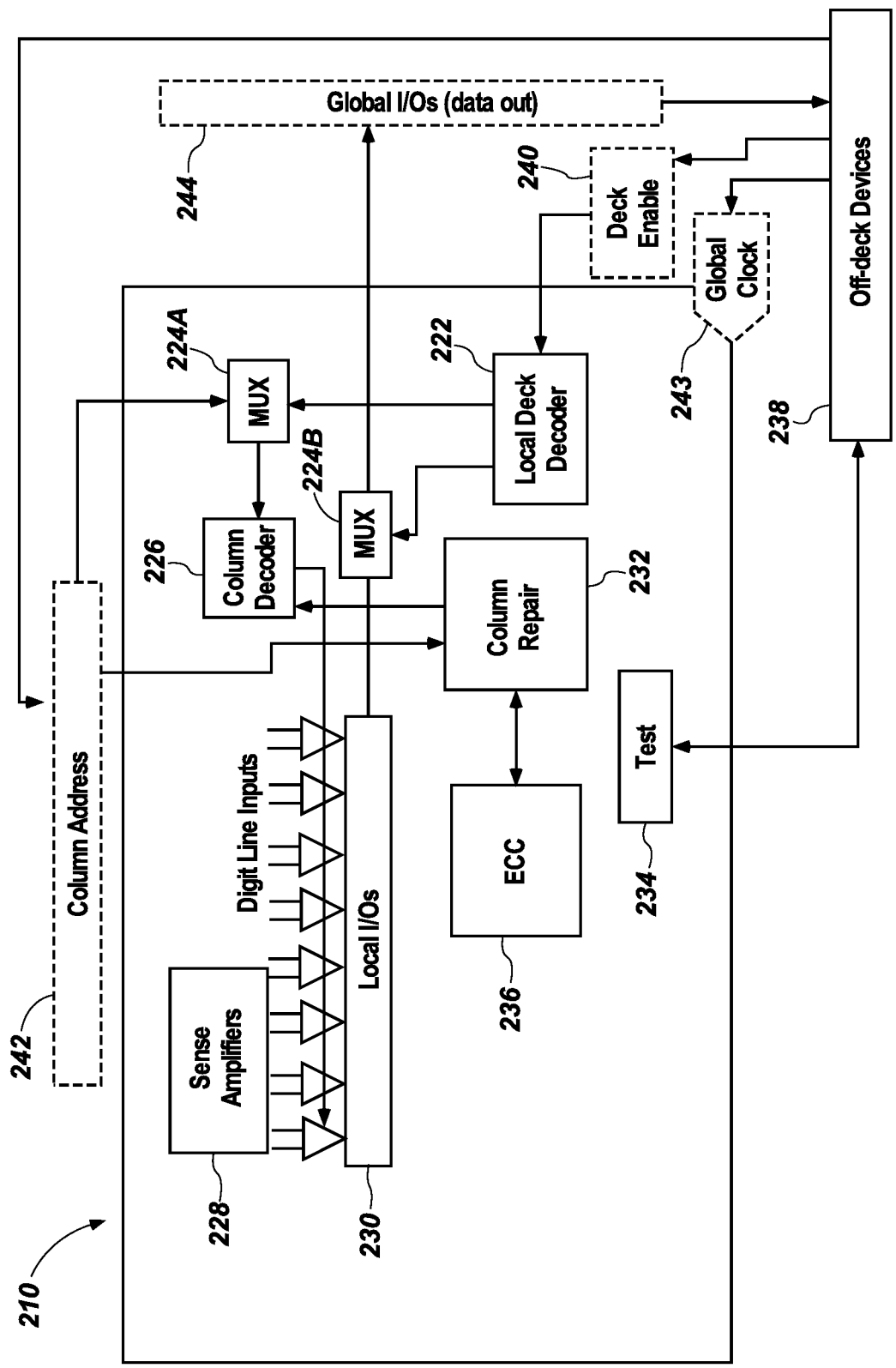
FIG. 2 is a block diagram of a first shared control logic level of the semiconductor device shown in FIG. 1A, in accordance with embodiments of the disclosure.

FIG. 2 is a block diagram of a configuration of a control logic level 210 for use in one or more of the decks 106 (FIG. 1A) of the stack structure 104 (FIG. 1A) of the semiconductor device 100 shown in FIG. 1A. The configuration of the control logic level 210 may correspond to a configuration of one or more (e.g., each) of the control logic levels 110 (e.g., the first control logic level 110A, the second control logic level 110B) shown in FIG. 1A. Alternatively, the configuration of the control logic level 210 may correspond to a configuration of one or more (e.g., each) of the additional control logic levels 112 (e.g., the first additional control logic level 112A, the second additional control logic level 112B) shown in FIG. 1A. The control logic level 210 may include a variety of control logic devices and circuits that would otherwise be included in off-deck circuitry (e.g., circuitry not presented within the control logic level 210), such as circuitry within a base control logic structure (e.g., the base control logic structure 102 shown in FIG. 1A). For example, as shown in FIG. 2, an assembly of control logic devices and circuits present within the control logic level 210 may include one or more (e.g., each) of a local deck decoder 222, MUX 224 (illustrated in FIG. 2 as a first MUX 224A and a second MUX 224B), a column decoder 226, sense amplifiers 228, local I/O devices 230, a column repair device 232, a memory test device 234, and an ECC device 236. The assembly of control logic devices and circuits present within the control logic level 210 may be operatively associated with (e.g., in electrical communication with) off-deck devices 238 (e.g., a controller, a host, global I/O devices) located outside of the control logic level 210, such as within the base control logic structure 102 shown in FIG. 1A. The off-deck devices 238 may send a variety signals to the control logic level 210, such as a deck enable signal 240, a column address signal 242, a global clock signal 243; and may also receive a variety of signals from the control logic level 210, such as a global data signal 244. While FIG. 2 depicts a particular configuration of the control logic level 210, one of ordinary skill in the art will appreciate that different control logic assembly configurations, including different control logic devices and circuits and/or different arrangements of control logic devices and circuits, are known in the art, which may be adapted to be employed in embodiments of the disclosure. FIG. 2 illustrates just one non-limiting example of the control logic level 210.

As shown in FIG. 2, one or more off-deck devices 238 located outside of the control logic level 210 (e.g., in the base control logic structure 102 shown in FIG. 1A) may be configured and operated to convey signals (e.g., a deck enable signal 240, a column address signal 242) to different devices of the control logic level 210. For example, the off-deck devices 238 may send a deck enable signal 240 to the local deck decoder 222, which may decode the deck enable signal 240 and activate one or more of the MUX 224 (e.g., the first MUX 224A and/or the second MUX 224B) of the control logic level 210. As described in further detail below, when activated, the MUX 224 may individually be configured and operated to select one of several input signals and then forward the selected input into a single line.

The first MUX 224A (e.g., a column MUX) of the control logic level 210 may be in electrical communication with the local deck decoder 222 and the column decoder 226 of the control logic level 210. The first MUX 224A may be activated by signal(s) from the local deck decoder 222, and may be configured and operated to selectively forward at least one column address signal 242 from the off-deck devices 238 to the column decoder 226. The column decoder 226 may be configured and operated to select particular digit lines (e.g., bit lines) of a deck (e.g., one of the first deck 106A, the second deck 106B, and the third deck 106C shown in FIG. 1A) including (e.g., sharing) the control logic level 210 based on the column address selection signal received thereby.

The column repair device 232 of the control logic level 210 may be in electrical communication with the column decoder 226, and may be configured and operated to substitute a defective column of memory elements of a memory element array of a memory level (e.g., one of the memory levels 108A, 108B, 108C shown in FIG. 1A) operatively associated with the control logic level 210 for a spare, non-defective column of memory elements of the memory element array of the memory level. The column repair device 232 may transform a column address signal 242 directed to the column decoder 226 (e.g., from the first MUX 224A) identifying the defective column of memory elements into another column address signal identifying the spare, non-defective column of memory elements. Defective columns of memory elements may, for example, be determined using the memory test device 234 of the control logic level 210, as described in further detail below.

The ECC device 236 of the control logic level 210 may be configured and operated to generate an ECC code (also known as "check bits"). The ECC code may correspond to a particular data value, and may be stored along with the data value in a memory element of a memory level (e.g., one of the memory levels 108A, 108B, 108C shown in FIG. 1A) operatively associated with the control logic level 210. When the data value is read back from the memory element, another ECC code is generated and compared with the previously generated ECC code to access the memory element. If non-zero, the difference in the previously generated ECC code and the newly generated ECC code indicates that an error has occurred. If an error condition is detected, the ECC device 236 may then be utilized to correct the erroneous data.

The memory test device 234 of the control logic level 210 may be configured and operated to identify defective (e.g., faulty) memory elements of a memory element array of a memory level (e.g., one of the memory levels 108A, 108B, 108C shown in FIG. 1A) operatively associated with the control logic level 210. The memory test device 234 may attempt to access and write test data to memory elements at different column addresses within the memory element array. The memory test device 234 may then attempt to read data stored at the memory elements, and compare the read data to the test data expected at the memory elements. If the read data is different than the expected test data, the memory test device 234 may identify the memory elements as defective. The defective memory elements (e.g., defective columns of memory elements) identified by the memory test device 234 may then be acted upon and/or avoided by other components (e.g., the column repair device 232) of the control logic level 210.

With continued reference to FIG. 2, the local I/O devices 230 of the control logic level 210 may be configured and operated to receive data from digit lines selected by the column decoder 226 during read operations, and to output data to digit lines selected by the column decoder 226 during write operations. As shown in FIG. 2, the local I/O devices 230 may include sense amplifiers 228 configured and operated to receive digit line inputs from the digit lines selected by the column decoder 226 and to generate digital data values during read operations. During write operations, the local I/O devices 230 may program data into memory elements of a memory level operatively associated with the control logic level 210 by placing proper voltages on the digit lines selected by the column decoder 226. For binary operation, one voltage level is typically placed on a digit line to represent a binary "1" and another voltage level to represent a binary "0."

The second MUX 224B of the control logic level 210 may be in electrical communication with the local I/O devices 230 and the local deck decoder 222. The second MUX 224B may be activated by signal(s) received from the local deck decoder 222, and may be configured and operated to receive digital data values generated by the local I/O devices 230 and to generate a global data signal 244 therefrom. The global data signal 244 may be forwarded to one or more off-deck devices 238 (e.g., a controller).

In accordance with embodiments of the disclosure, one or more of the components (e.g., one or more of the local deck decoder 222, the MUX 224 (the first MUX 224A and/or the second MUX 224B), the column decoder 226, the sense amplifiers 228, the local I/O devices 230, the column repair device 232, the ECC device 236, the memory test device 234) of the control logic level 210 may employ one or more control logic devices, such as one or more TFT CMOS devices. Non-limiting examples of different control logic devices that may be included in one or more components of the control logic level 210 include one of more of inverters (e.g., CMOS inverters, such as balanced CMOS inverters), transmission pass gates (e.g., CMOS transmission pass gates, such as balanced CMOS transmission pass gates), ring oscillators, and negative-AND (NAND) gates (e.g., two-input NAND gates, such as balanced two-input NAND gates). If present, the TFT CMOS devices may include horizontally neighboring transistors (e.g., horizontally neighboring NMOS and PMOS transistors) and/or may include vertically neighboring transistors (e.g., vertically neighboring NMOS and PMOS transistors). The horizontally neighboring transistors (if any) may comprise vertical transistors (e.g., vertical NMOS transistor(s), vertical PMOS transistor(s)) exhibiting channels vertically extending between vertically displaced source and drain regions, or may comprise horizontal transistors (e.g., horizontal NMOS transistor(s), horizontal PMOS transistor(s)) exhibiting channels horizontally extending between horizontally displaced source and drain regions. The vertically neighboring transistors (if any) may comprise vertical transistors (e.g., vertical NMOS transistor(s), vertical PMOS transistor(s)) exhibiting channels vertically extending between vertically displaced source and drain regions, or may comprise horizontal transistors (e.g., horizontal NMOS transistor(s), horizontal PMOS transistor(s)) exhibiting channels horizontally extending between horizontally displaced source and drain regions. Accordingly, one or more components of at least one of the control logic levels 110 (e.g., the first control logic level 110A, the second control logic level 110B) employed by one or more of the decks 106 (e.g., the first deck 106A, the second deck 106B, the third deck 106C) of the stack structure 104 of the semiconductor device 100 previously described with reference to FIG. 1A may include one or more TFT CMOS devices including at least one NMOS transistor (e.g., a vertical NMOS transistor, a horizontal NMOS transistor, an NMOS fin field-effect transistor (FinFET)) neighboring (e.g., horizontally neighboring, vertically neighboring) at least one PMOS transistor (e.g., a vertical PMOS transistor, a horizontal PMOS transistor, a PMOS FinFET).

Figure 3:
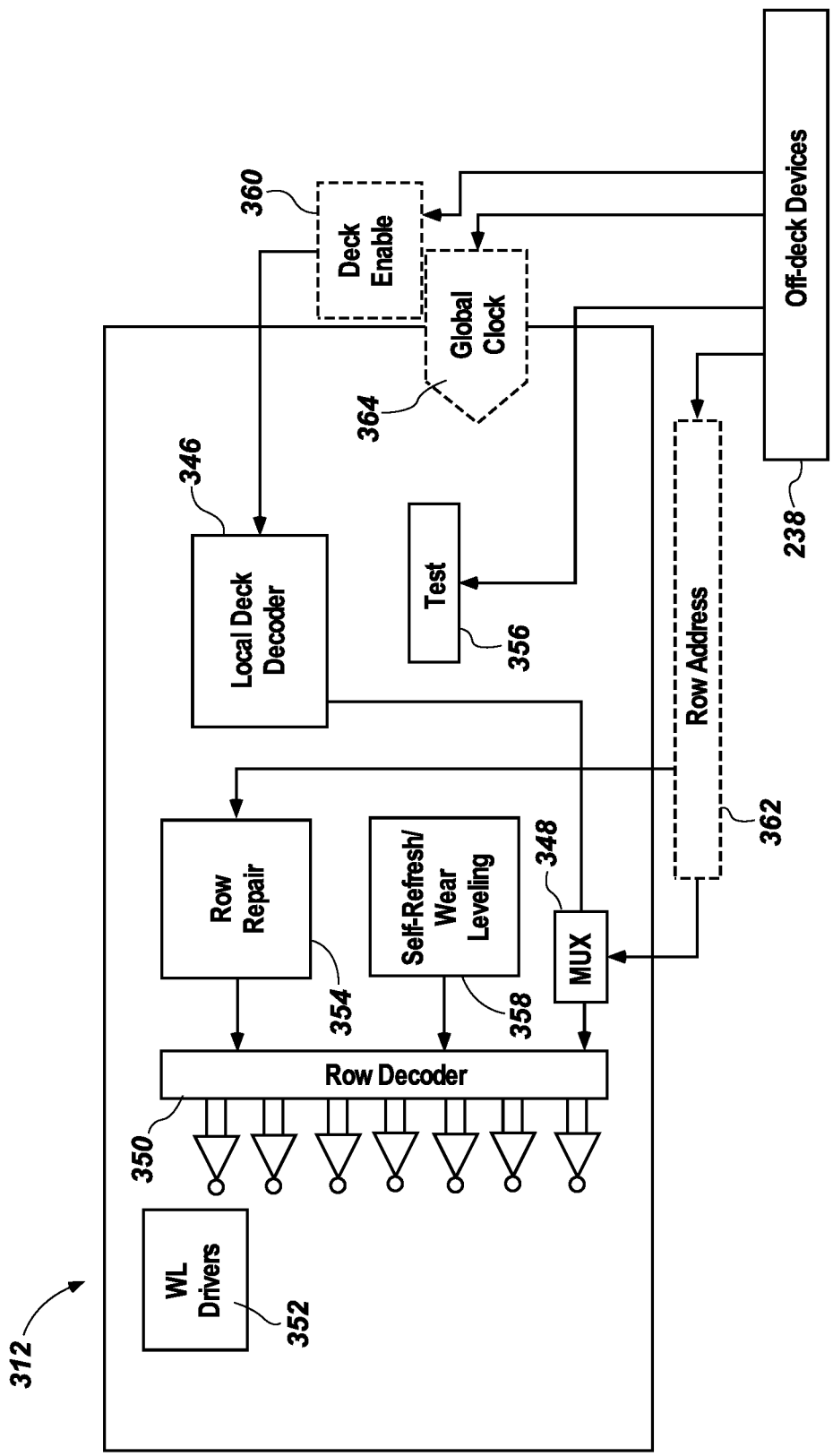
FIG. 3 is a block diagram of another shared control logic level of the semiconductor device shown in FIG. 1A, in accordance with embodiments of the disclosure.

FIG. 3 is a block diagram of a configuration of an additional control logic level 312 for use in one or more of the decks 106 (FIG. 1A) of the stack structure 104 (FIG. 1A) of the semiconductor device 100 shown in FIG. 1A. The configuration of the additional control logic level 312 may correspond to a configuration of one or more (e.g., each) of the additional control logic levels 112 (e.g., the first additional control logic level 112A, the second additional control logic level 112B) shown in FIG. 1A. Alternatively, the configuration of the additional control logic level 312 may correspond to a configuration of one or more (e.g., each) of the control logic levels 110 (e.g., the first control logic level 110A, the second control logic level 110B) shown in FIG. 1A. The additional control logic level 312 includes a variety of control logic devices and circuits not present in other levels (e.g., the control logic levels 110) and/or structures (e.g., the base control logic structure 102) of the semiconductor device 100 shown in FIG. 1A. Accordingly, the additional control logic level 312 exhibits a different configuration than the control logic level 210 previously described with reference to FIG. 2. For example, as shown in FIG. 3, an assembly of control logic devices and circuits present within the additional control logic level 312 may include one or more (e.g., each) of a local deck decoder 346, a MUX 348, a row decoder 350, word line (WL) drivers 352, a row repair device 354, a memory test device 356, and a self-refresh/wear leveling device 358. The assembly of control logic devices and circuits present within the additional control logic level 312 may be operatively associated with (e.g., in electrical communication with) the off-deck devices 238 (e.g., controller, host, global I/O devices) located outside of the additional control logic level 312, such as within the base control logic structure 102 shown in FIG. 1A. The off-deck devices 238 may send a variety signals to the additional control logic level 312, such as a deck enable signal 360, a row address signal 362, and a global clock signal 364. While FIG. 3 depicts a particular configuration of the additional control logic level 312, one of ordinary skill in the art will appreciate that different control logic assembly configurations, including different control logic devices and circuits and/or different arrangements of control logic devices and circuits, are known in the art, which may be adapted to be employed in embodiments of the disclosure. FIG. 3 illustrates just one non-limiting example of the additional control logic level 312.

As shown in FIG. 3, one or more of the off-deck devices 238 located outside of the additional control logic level 312 (e.g., in the base control logic structure 102 shown in FIG. 1A) may be configured and operated to convey signals (e.g., a deck enable signal 360, a row address signal 362) to different devices of the additional control logic level 312. For example, the off-deck devices 238 may send a deck enable signal 360 to the local deck decoder 346, which may decode the deck enable signal 360 and activate the MUX 348 of the additional control logic level 312.

The MUX 348 (e.g., a row MUX) of the additional control logic level 312 may be in electrical communication with the local deck decoder 346 and the row decoder 350 of the additional control logic level 312. The MUX 348 may be activated by signal(s) from the local deck decoder 346, and may be configured and operated to selectively forward at least one row address signal 362 from the off-deck devices 238 to the row decoder 350. The row decoder 350 may be configured and operated to select particular word lines of one of the decks 106 (e.g., one of the first deck 106A, the second deck 106B, and the third deck 106C shown in FIG. 1A) employing the additional control logic level 312 based on the row address signal 362 received thereby.

With continued reference to FIG. 3, the row repair device 354 of the additional control logic level 312 may be in electrical communication with the row decoder 350, and may be configured and operated to substitute a defective row of memory elements of a memory element array of a memory level (e.g., one of the memory levels 108A, 108B, 108C shown in FIG. 1A) operatively associated with the additional control logic level 312 for a spare, non-defective row of memory elements of the memory element array of the memory level. The row repair device 354 may transform a row address signal 362 directed to the row decoder 350 (e.g., from the MUX 348) identifying the defective row of memory elements into another row address signal identifying the spare, non-defective row of memory elements. Defective rows of memory elements may, for example, be determined using the memory test device 356 of the additional control logic level 312, as described in further detail below.

The WL drivers 352 of the additional control logic level 312 may be in electrical communication with the row decoder 350, and may be configured and operated to activate word lines of a deck (e.g., one of the first deck 106A, the second deck 106B, and the third deck 106C shown in FIG. 1A) employing the additional control logic level 312 based on word line selection commands received from the row decoder 350. The memory elements of a memory level (e.g., one of the memory levels 108A, 108B, 108C shown in FIG. 1A) operatively associated with the additional control logic level 312 may be accessed by way of access devices of the memory level for reading or programming by voltages placed on the word lines using the WL drivers 352.

The self-refresh/wear leveling device 358 of the additional control logic level 312 may be in electrical communication with the row decoder 350, and may be configured and operated to periodically recharge the data stored in memory elements of a memory level (e.g., one of the memory levels 108A, 108B, 108C shown in FIG. 1A) operatively associated with the additional control logic level 312. During a self-refresh/wear leveling operation, the self-refresh/wear leveling device 358 may be activated in response to an external command signal, and may generate different row address signals that may be forwarded to the row decoder 350. The row decoder 350 may then select particular word lines of a deck (e.g., one of the first deck 106A, the second deck 106B, and the third deck 106C shown in FIG. 1A) employing the additional control logic level 312 based on the different row address signals received from the self-refresh/wear leveling device 358. The row decoder 350 may then communicate with the WL drivers 352 to activate the selected word lines, and charges accumulated in capacitors of memory elements operatively associated with the selected word lines may then be amplified by a sense amplifier and then stored in the capacitors again.

The memory test device 356 of the additional control logic level 312 may be configured and operated to identify defective (e.g., faulty) memory elements of a memory element array of a memory level (e.g., one of the memory levels 108A, 108B, 108C shown in FIG. 1A) operatively associated with the additional control logic level 312. The memory test device 356 may attempt to access and write test data to memory elements at different row addresses within the memory element array. The memory test device 356 may then attempt to read data stored at the memory elements, and compare the read data to the test data expected at the memory elements. If the read data is different than the expected test data, the memory test device 356 may identify the memory elements as defective. The defective memory elements (e.g., defective rows of memory elements) identified by the memory test device 356 may then be acted upon and/or avoided by other components (e.g., the row repair device 354) of the additional control logic level 312.

In accordance with embodiments of the disclosure, one or more of the components (e.g., one or more of the local deck decoder 346, the MUX 348, the row decoder 350, the WL drivers 352, the row repair device 354, the memory test device 356, and the self-refresh/wear leveling device 358) of the additional control logic level 312 may employ one or more control logic devices, such as TFT CMOS devices. Non-limiting examples of different control logic devices that may be included in one or more components of the additional control logic level 312 include one of more of inverters (e.g., CMOS inverters, such as balanced CMOS inverters), transmission pass gates (e.g., CMOS transmission pass gates, such as balanced CMOS transmission pass gates), ring oscillators, and negative-AND (NAND) gates (e.g., two-input NAND gates, such as balanced two-input NAND gates). If present, the TFT CMOS devices may include horizontally neighboring transistors (e.g., horizontally neighboring NMOS and PMOS transistors) and/or may include vertically neighboring transistors (e.g., vertically neighboring NMOS and PMOS transistors). The horizontally neighboring transistors (if any) may comprise vertical transistors (e.g., vertical NMOS transistor(s), vertical PMOS transistor(s)) exhibiting channels vertically extending between vertically displaced source and drain regions, or may comprise horizontal transistors (e.g., horizontal NMOS transistor(s), horizontal PMOS transistor(s)) exhibiting channels horizontally extending between horizontally displaced source and drain regions. The vertically neighboring transistors (if any) may comprise vertical transistors (e.g., vertical NMOS transistor(s), vertical PMOS transistor(s)) exhibiting channels vertically extending between vertically displaced source and drain regions, or may comprise horizontal transistors (e.g., horizontal NMOS transistor(s), horizontal PMOS transistor(s)) exhibiting channels horizontally extending between horizontally displaced source and drain regions. Accordingly, one or more components of at least one of the additional control logic levels (e.g., the first additional control logic level 112A, the second additional control logic level 112B) employed by one or more of the decks 106 (e.g., the first deck 106A, the second deck 106B, the third deck 106C) of the stack structure 104 of the semiconductor device 100 previously described with reference to FIG. 1A may include one or more TFT CMOS devices including at least one NMOS transistor (e.g., a vertical NMOS transistor, a horizontal NMOS transistor, an NMOS FinFET) neighboring (e.g., horizontally neighboring, vertically neighboring) at least one PMOS transistor (e.g., a vertical PMOS transistor, a horizontal PMOS transistor, a PMOS FinFET).

Thus, in accordance with embodiments of the disclosure, a semiconductor device comprises a stack structure comprising decks each comprising a memory level comprising memory elements, a control logic level vertically adjacent and in electrical communication with the memory level and comprising control logic devices configured to effectuate a portion of control operations for the memory level, and an additional control logic level vertically adjacent and in electrical communication with the memory level and comprising additional control logic devices configured to effectuate an additional portion of the control operations for the memory level.

Furthermore, in accordance with additional embodiments of the disclosure, a method of operating a semiconductor device comprises controlling functions of a stack structure comprising memory levels using one or more control logic levels in electrical communication with the memory levels. Additional, different functions of the stack structure are controlled using one or more additional control logic levels in electrical communication with the memory levels. Further, different functions of the stack structure are controlled using a base control logic structure in electrical communication with the one or more control logic levels and the one or more additional control logic levels of the stack structure.

Figure 4A:
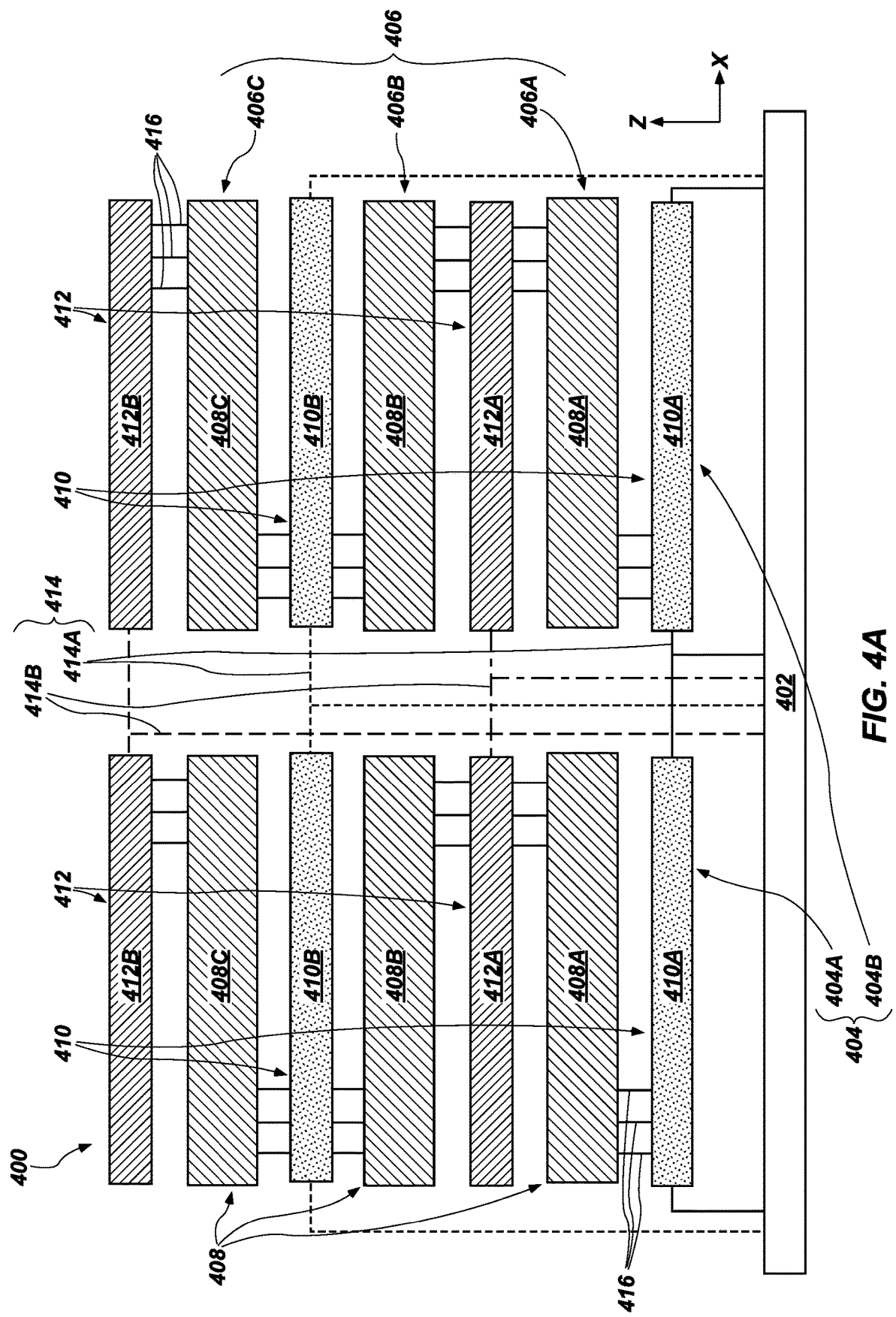
FIGS. 4A and 4B are a simplified side elevation (FIG. 4A) and plan (FIG. 4B) views of a semiconductor device, in accordance with additional embodiments of the disclosure.

While FIG. 1A depicts the semiconductor device 100 as including a single stack structure 104, the semiconductor device 100 may include multiple (e.g., more than one) stack structures 104. By way of non-limiting example, FIG. 4A shows a simplified side elevation view of a semiconductor device 400 (e.g., a 3D memory device), in accordance with additional embodiments of the disclosure. As shown in FIG. 4A, the semiconductor device 400 includes a base control logic structure 402, and multiple stack structures 404 overlying the base control logic structure 402. Throughout the remaining description and the accompanying figures, functionally similar features are referred to with similar reference numerals incremented by 100. To avoid repetition, not all features shown in FIG. 4A are described in detail herein. Rather, unless described otherwise below, a feature designated by a feature designated by a reference numeral that is a 100 increment of the reference numeral of a previously described feature (whether the previously described feature is first described before the present paragraph, or is first described after the present paragraph) will be understood to be substantially similar to the previously described feature.

As shown in FIG. 4A, the semiconductor device 400 may include a first stack structure 404A, and a second stack structure 404B laterally neighboring the first stack structure 404A. Each of the stack structures 404 may be substantially similar to the stack structure 104 previously described with reference to FIG. 1A. For example, each of the stack structures 404 may include decks 406 (e.g., a first deck 406A, a second deck 406B, a third deck 406C) including memory levels 408 (e.g., a first memory level 408A, a second memory level 408B, a third memory level 408C), control logic levels 410 (e.g., a first control logic level 410A, a second control logic level 410B), and additional control logic levels 412 (e.g., a first additional control logic level 412A, a second additional control logic level 412B). Each of the decks 406 of each of the stack structures 404 may include one of the memory levels 408 positioned vertically between one of the control logic levels 410 and one of the additional control logic levels 412, wherein the control logic levels 410 and the additional control logic levels 412 exhibit different configurations (e.g., different control logic devices, different assemblies of control logic devices) than one another, and are configured and operated to perform different control operations than one another. Each of the control logic levels 410 of each of the stack structures 404 may, for example, exhibit a configuration similar to that of the control logic level 210 previously described with reference to FIG. 2; and each of the additional control logic levels 412 of each of the stack structures 404 may, for example, exhibit a configuration similar to that of the additional control logic level 312 previously described with reference to FIG. 3. In addition, the base control logic structure 402 of the semiconductor device 400 may be in electrical communication with the decks 406 of each of the stack structures 404 by way of interconnect structures 414 extending between the base control logic structure 402 and the control logic levels 410 and the additional control logic levels 412 of each of the stack structures 404; and the memory levels 408 of each of the stack structures 404 may be in electrical communication with the control logic levels 410 and the additional control logic levels 412 vertically adjacent thereto by way of additional interconnect structures 416.

The semiconductor device 400 may include any desired number of the stack structures 404. For clarity and ease of understanding of the drawings and related description, FIG. 4A shows the semiconductor device 400 as including two (2) stack structures 104. In additional embodiments, the semiconductor device 400 includes a different number of stack structures 404. For example, the semiconductor device 400 may include greater than or equal to four (4) stack structures 404, greater than or equal to eight (8) stack structures 404, greater than or equal to sixteen (16) stack structures 404, greater than or equal to thirty-two (32) stack structures 404, greater than or equal to sixty-four (64) stack structures 404, greater than or equal to one hundred twenty-eight (128) stack structures 404, greater than or equal to two hundred fifty-six (256) stack structures 404, greater than or equal to five hundred twelve (512) stack structures 404, or greater than or equal to one thousand twenty-four (1024) stack structures 404. In addition, the semiconductor device 400 may include any desired distribution of the stack structures 404. For example, the semiconductor device 400 may include rows of the stack structures 404 extending in a first lateral direction, and columns of the stack structures 404 extending in a second lateral direction perpendicular to the first lateral direction.

Figure 4B:
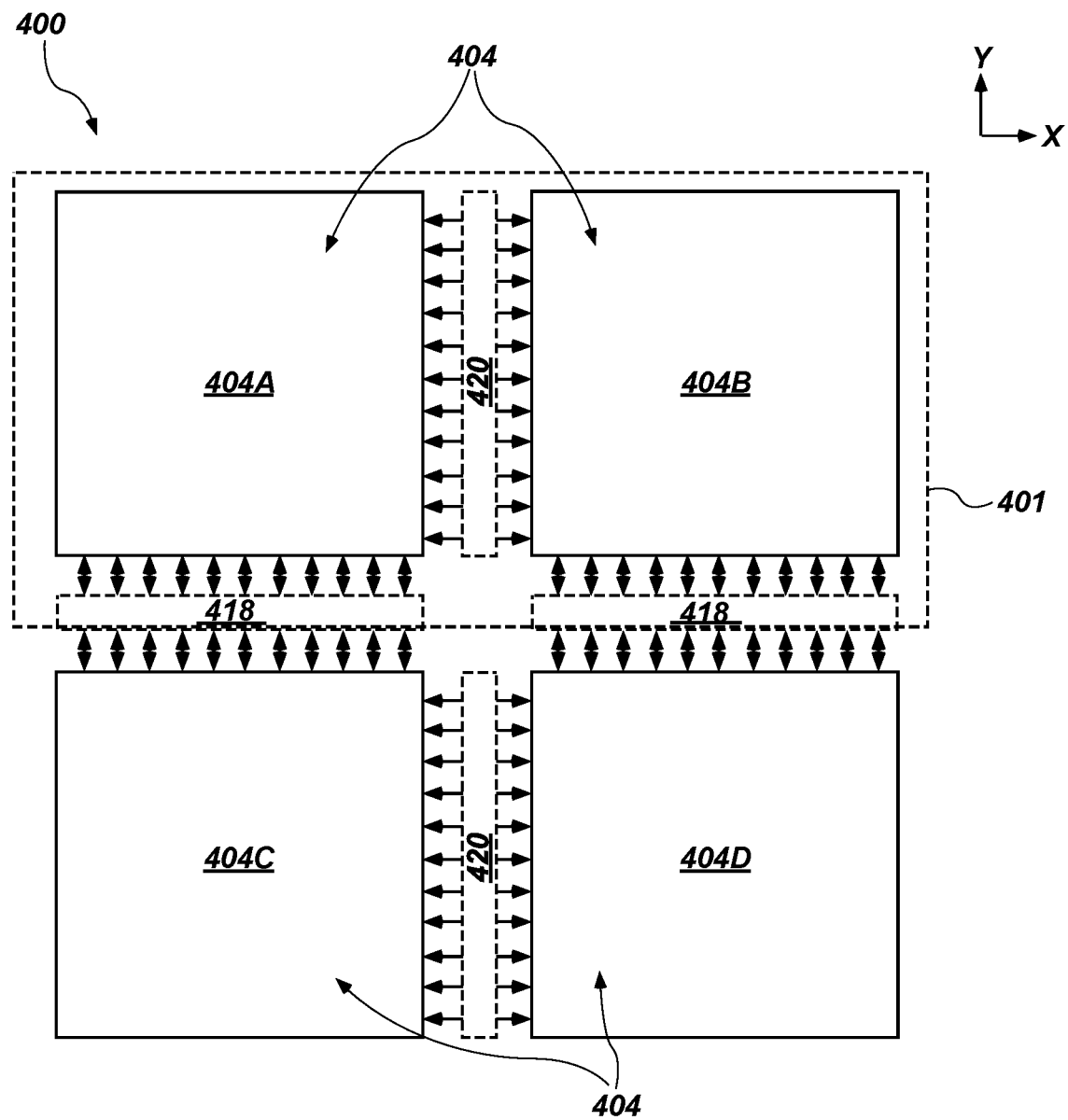

As shown in FIG. 4A, the interconnect structures 414 of the semiconductor device 400 may include first interconnect structures 414A and second interconnect structures 414B. The first interconnect structures 414A may extend between and electrically couple the base control logic structure 402 and the control logic levels 410 of the each of the stack structures 404. The second interconnect structures 414B may extend between and electrically couple the base control logic structure 402 and the additional control logic levels 412 of each of the stack structures 404. At least some (e.g., each) of the first interconnect structures 414A may be disposed within a different lateral region (e.g., a different lateral area) across the semiconductor device 400 than at least some (e.g., each) of the second interconnect structures 414B. The first interconnect structures 414A may, for example, be disposed within at least one socket area located between at least two (2) laterally neighboring stack structures 404 (e.g., the first stack structure 404A, and the second stack structure 404B); and the second interconnect structures 414B may be disposed within at least one other socket area different than the socket area. By way of non-limiting example, FIG. 4B shows a plan view of the semiconductor device 400 shown in FIG. 4A, including different socket areas for connecting the base control logic structure 402 (FIG. 4A) to the control logic levels 410 (FIG. 4A) and the additional control logic levels 412 (FIG. 4A) of the stack structures 404. In FIG. 4B, the dashed line 401 corresponds to the lateral area of the semiconductor device 400 illustrated in FIG. 4A (e.g., the lateral area of the semiconductor device 400 including the first stack structure 404A and the second stack structure 404B). As shown in FIG. 4B, first socket areas 418 may extend in a first lateral direction (e.g., the X-direction) and may be positioned between laterally neighboring stack structures 404 (e.g., the first stack structure 404A and third stack structure 404C neighboring the first stack structure 404A in the Y-direction; the second stack structure 404B and a third stack structure 404C neighboring the second stack structure 404B in the Y-direction); and second socket areas 420 may extend in a second lateral direction (e.g., the Y-direction) and may be positioned between additional laterally neighboring stack structures 404 (e.g., the first stack structure 404A and the second stack structure 404B neighboring the first stack structure 404A in the X-direction; the third stack structure 404C and a fourth stack structure 404D neighboring the third stack structure 404C in the X-direction). The first socket areas 418 may, for example, laterally contain the first interconnect structures 414A (FIG. 4A) extending from the base control logic structure 402 (FIG. 4A) to the control logic levels 410 (FIG. 4A) of the stack structures 404; and the second socket areas 420 may, for example, laterally contain the second interconnect structures 414B (FIG. 4A) extending from the base control logic structure 402 (FIG. 4A) to the additional control logic levels 412 (FIG. 4A) of the stack structures 404. In additional embodiments, the first socket areas 418 may laterally contain the second interconnect structures 414B (FIG. 4A) extending between the base control logic structure 402 (FIG. 4A) and the additional control logic levels 412 (FIG. 4A) of the stack structures 404; and the second socket areas 420 may laterally contain the first interconnect structures 414A (FIG. 4A) extending between the base control logic structure 402 (FIG. 4A) and the control logic levels 410 (FIG. 4A) of the stack structures 404.

With returned reference to FIG. 4A, one or more of the interconnect structures 414 of the semiconductor device 400 may be shared by (e.g., common to) horizontally neighboring stack structures 404 (e.g., the first stack structure 404A and the second stack structure 404B) of the semiconductor device 400. At least some (e.g., all) corresponding (e.g., substantially similarly vertically positioned) control logic levels 410 of the horizontally neighboring stack structures 404 may share one or more of the first interconnect structures 414A, and/or at least some (e.g., all) corresponding additional control logic levels 412 of the laterally neighboring stack structures 404 may share one or more of the second interconnect structures 414B. By way of non-limiting example, as shown in FIG. 4A, at least one of the first interconnect structures 414A may be shared by the first control logic levels 410A of the first stack structure 404A and the second stack structure 404B, at least one other of the first interconnect structures 414A may be shared by the second control logic levels 410B of the first stack structure 404A and the second stack structure 404B, at least one of the second interconnect structures 414B may be shared by the first additional control logic levels 412A of the first stack structure 404A and the second stack structure 404B, and at least one other of the second interconnect structures 414B may be shared by the second additional control logic levels 412B of the first stack structure 404A and the second stack structure 404B. If one or more interconnect structures 414 are shared by two horizontally neighboring stack structures 404 (e.g., the first stack structure 404A and the second stack structure 404B) of the semiconductor device 400, one or more devices located outside of the horizontally neighboring stack structures 404 may be used to selectively activate one of the two horizontally neighboring stack structures 404. For example, a device (e.g., a controller) within the base control logic structure 402 may send a stack enable signal to one or more decoders (e.g., one or more local stack decoders) of one of the first stack structure 404A and the second stack structure 404B, which may then decode the stack enable signal and selectively activate the one of the first stack structure 404A and the second stack structure 404B relative to the other of the first stack structure 404A and the second stack structure 404B. In additional embodiments, the interconnect structures 414 of the semiconductor device 400 are not shared by horizontally neighboring stack structures 404 (e.g., the first stack structure 404A and the second stack structure 404B) of the semiconductor device 400.

Thus, in accordance with embodiments of the disclosure, a memory device comprises a base control logic structure, stack structures over the base control logic structure, first interconnect structures, and second interconnect structures. The stack structures each comprise a first control logic level over the base control logic structure, a first memory level over and electrically coupled to the first control logic level, a first additional control logic level over and electrically coupled to the first memory level, a second memory level over and electrically coupled to the first additional control logic level, and a second control logic level over and electrically coupled to the second memory level. The first interconnect structures extend from the base control logic structure to the first control logic level and the second control logic level of each of the stack structures. The second interconnect structures extend from the base control logic structure to the first additional control logic level of each of the stack structures.

Figure 5:
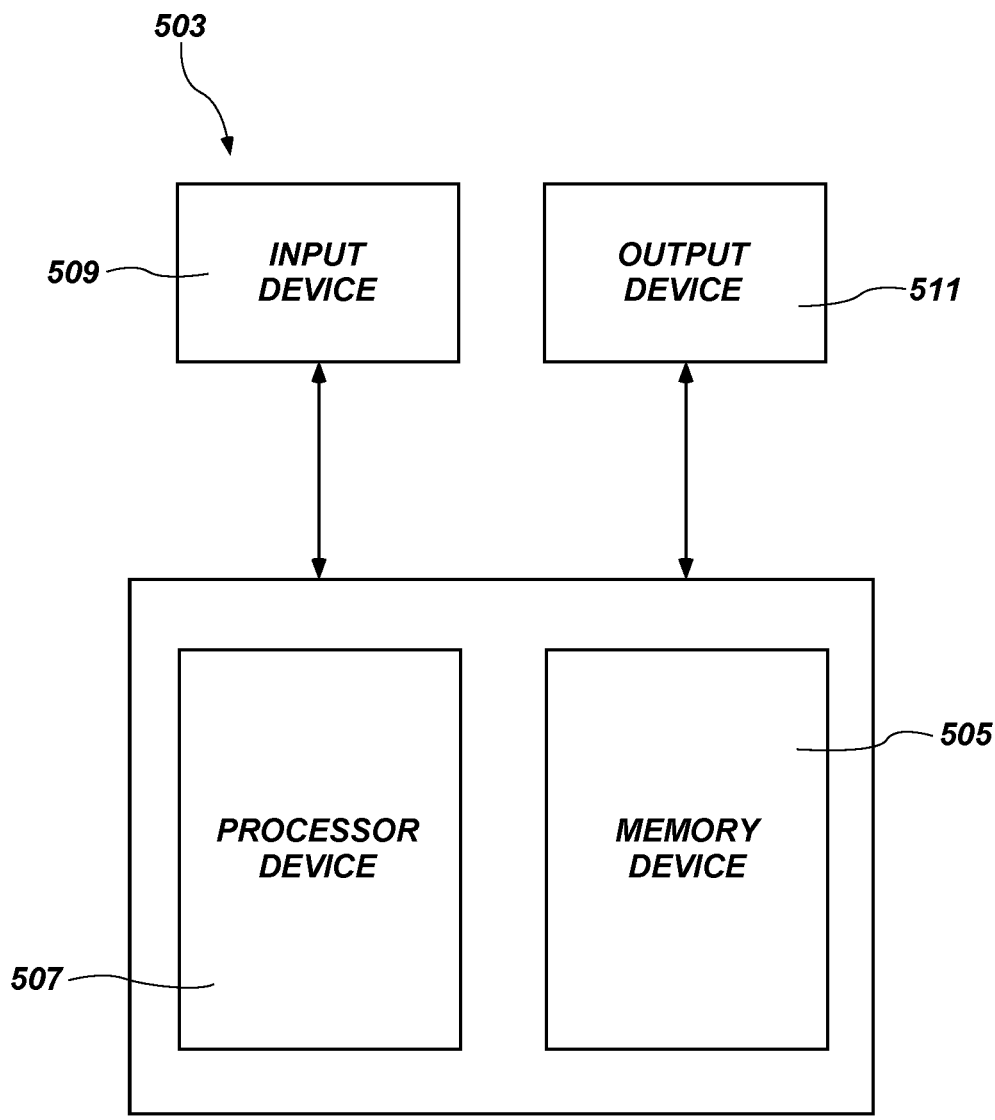
FIG. 5 is a schematic block diagram illustrating an electronic system, in accordance with embodiments of the disclosure.

Semiconductor devices (e.g., the semiconductor devices 100, 400) including semiconductor device structures (e.g., the stack structures 104, 404; the base control logic structures 102, 402) in accordance with embodiments of the disclosure may be used in embodiments of electronic systems of the disclosure. For example, FIG. 5 is a block diagram of an illustrative electronic system 503 according to embodiments of disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment of a semiconductor device previously described herein (e.g., semiconductor devices 100, 400), wherein different decks (e.g., the decks 106, 406) of one or more stack structure (e.g., the stack structures 104, 404) of the semiconductor device each include a memory level (e.g., one of the memory levels 108, 408), a control logic level (e.g., one of the control logic levels 110, 410), and an additional control logic level (e.g., one of the additional control logic levels 112, 412). One or more of the control logic levels and/or one or more of the additional control logic levels of the stack structure(s) may be shared between vertically neighboring decks of the stack structure(s). The electronic system 503 may further include at least one electronic signal processor device 507 (often referred to as a "microprocessor"). The electronic signal processor device 507 may, optionally, include an embodiment of a semiconductor device previously described herein (e.g., the semiconductor devices 100, 400). The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Thus, in accordance with embodiments of the disclosure, an electronic system comprises an input device, an output device, a processor device operably coupled to the input device and the output device, and a semiconductor device operably coupled to the processor device. The semiconductor device comprises a stack structure comprising decks. Each of the decks comprises a memory level, a control logic level vertically adjacent the memory level and comprising control logic devices configured to effectuate a portion of control operations for the memory level, and an additional control logic level vertically adjacent the memory level and comprising additional control logic devices configured to effectuate an additional portion of the control operations for the memory level.

The devices, structures, assemblies, and methods of the disclosure advantageously facilitate improved semiconductor device performance, reduced costs (e.g., manufacturing costs, material costs), increased miniaturization of components, and greater packaging density as compared to conventional devices, conventional structures, and conventional assemblies. The devices, structures, assemblies, and methods of the disclosure may also improve scalability, efficiency, and simplicity as compared to conventional devices, conventional structures, and conventional assemblies. For example, the configurations of the semiconductor devices (e.g., the semiconductor devices 100, 400) of the disclosure (including the configurations of the stack structures thereof exhibiting decks comprising memory levels, control logic levels, and additional control logic levels) may reduce the lateral dimensions of the base control logic structures (e.g., the base control logic structures 102, 402) thereof relative to conventional semiconductor device configurations, to facilitate relatively smaller stack structure (e.g., the stack structures 104, 404) lateral dimensions while maintaining or improving the efficiency thereof. Smaller stack structure lateral dimensions may, for example, facilitate relatively higher signal-to-noise ratios for memory read operations, and relatively reduced raw bit error rates. In addition, providing and sharing control operations for the memory levels (e.g., the memory levels 108, 408) of the stack structures (e.g., the stack structures 104, 404) of the disclosure by way of the control logic levels (e.g., the control logic levels 110, 410) and additional control logic levels (e.g., the additional control logic levels 112, 412) of the disclosure may provide increased performance and improved memory array, die, and/or socket area efficiency as compared to conventional stack structure configurations by facilitating parallel and localized deck and stack structure operations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A device, comprising:
    a first stack structure comprising:
        a first memory level comprising first memory cells;
        a first control logic level underlying the first memory level and comprising first control logic devices comprising first thin film transistors, the first control logic devices configured to effectuate a portion of control operations for the first memory level;
        a second control logic level overlying the first memory level and comprising second control logic devices comprising second thin film transistors, the second control logic devices configured to effectuate an additional portion of the control operations for the first memory level;
        a second memory level comprising second memory cells overlying the second control logic level, the second control logic devices of the second control logic level configured to effectuate a portion of control operations for the second memory level; and
        a third control logic level overlying the second memory level and comprising third control logic devices comprising third thin film transistors, the third control logic devices configured to effectuate an additional portion of the control operations for the second memory level.

2. The device of claim 1, wherein the first control logic devices and the second control logic devices comprise complementary metal oxide semiconductor devices.

3. The device of claim 1, further comprising a base control logic structure underlying the first stack structure and comprising third control logic devices configured to effectuate another portion of the control operations for the first memory level.

4. A device, further comprising:
    a first stack structure comprising:
        a first memory level comprising first memory cells;
        a first control logic level underlying the first memory level and comprising first control logic devices comprising first thin film transistors, the first control logic devices configured to effectuate a portion of control operations for the first memory level; and
        a second control logic level overlying the first memory level and comprising second control logic devices comprising second thin film transistors, the second control logic devices configured to effectuate an additional portion of the control operations for the first memory level; and
    a second stack structure neighboring the first stack structure in a first horizontal direction, the second stack structure comprising:
        a second memory level comprising second memory cells;
        a third control logic level underlying the second memory level and comprising third control logic devices comprising third thin film transistors, the third control logic devices configured to effectuate a portion of control operations for the second memory level; and
        a fourth control logic level overlying the second memory level and comprising fourth control logic devices comprising fourth thin film transistors, the fourth control logic devices configured to effectuate an additional portion of the control operations for the second memory level.

5. The device of claim 4, further comprising:
a third stack structure neighboring the first stack structure in a second horizontal direction orthogonal to the first horizontal direction, the third stack structure comprising:
   a third memory level comprising third memory cells;
   a fifth control logic level underlying the third memory level and comprising fifth control logic devices comprising fifth thin film transistors, the fifth control logic devices configured to effectuate a portion of control operations for the third memory level; and
   a sixth control logic level overlying the third memory level and comprising sixth control logic devices comprising sixth thin film transistors, the sixth control logic devices configured to effectuate an additional portion of the control operations for the third memory level.

6. The device of claim 5, wherein the second stack structure and the third stack structure have geometric configurations substantially similar to a geometric configuration of the first stack structure.

7. The device of claim 5, further comprising:
first interconnect structures horizontally disposed between and in electrical communication with the first stack structure and the second stack structure; and
second interconnect structures horizontally disposed between and in electrical communication with the first stack structure and the third stack structure.

8. The device of claim 7, further comprising a base control logic structure underlying the first stack structure, the second stack structure, and the third stack structure, the base control logic structure in electrical communication with the first interconnect structures and the second interconnect structures and comprising seventh control logic devices configured to effectuate additional control operations for the first memory level, the second memory level, and the third memory level.

9. The device of claim 7, wherein:
the first interconnect structures are in electrical communication with the first control logic level of the first stack structure and the third control logic level of the second stack structure; and
the second interconnect structures are in electrical communication with the second control logic level of the first stack structure and the sixth control logic level of the third stack structure.

10. A memory device, comprising:
stack structures each individually comprising:
   a control logic level;
   a memory level over and in electrical communication with the control logic level; and
   an additional control logic level over and in electrical communication with the memory level;
interconnect structures interposed between and in electrical communication with two of the stack structures neighboring one another in a first horizontal direction; and
additional interconnect structures interposed between and in electrical communication with two other of the stack structures neighboring one another in a second horizontal direction perpendicular to the first horizontal direction.

11. The memory device of claim 10, wherein the interconnect structures are electrically coupled to the control logic level of each of the two of the stack structures.

12. The memory device of claim 11, wherein the additional interconnect structures are electrically coupled to the additional control logic level of each of the two other of the stack structures.

13. The memory device of claim 10, wherein each of the stack structures further comprises:
an additional memory level over and in electrical communication with the additional control logic level; and
a further control logic level over and in electrical communication with the additional memory level.

14. The memory device of claim 13, wherein:
the interconnect structures are electrically coupled to the control logic level and the further control logic level of each of the two of the stack structures; and
the additional interconnect structures are electrically coupled to the additional control logic level of each of the two other of the stack structures.

15. The memory device of claim 10, further comprising a base control logic structure underlying the stack structures.

16. The memory device of claim 15, wherein the base control logic structure, the control logic level of each of the stack structures, and the additional control logic level of each of the stack structures are configured to control different operations of the stack structures than one another.

17. The memory device of claim 10, wherein:
the control logic level comprises control logic devices configured to control row operations for an array of memory cells of the memory level; and
the additional control logic level comprises additional control logic devices configured to control column operations for the array of memory cells of the memory level.

18. An electronic system, comprising:
an input device;
an output device;
a processor device operably coupled to the input device and the output device; and
a memory device operably coupled to the processor device and comprising:
   stack structures each comprising decks, each of the decks comprising:
      a memory level comprising memory elements;
      a control logic level vertically under and in electrical communication with the memory level and comprising control logic devices configured to effectuate a portion of control operations for the memory level; and
      an additional control logic level vertically over and in electrical communication with the memory level and comprising additional control logic devices configured to effectuate an additional portion of the control operations for the memory level;
   interconnect structures interposed between and in electrical communication with two of the stack structures neighboring one another in a first horizontal direction; and
   additional interconnect structures interposed between and in electrical communication with two other of the stack structures neighboring one another in a second horizontal direction perpendicular to the first horizontal direction.

19. The electronic system of claim 18, wherein each the memory level of each of the decks of each of the stack structures comprises rows of memory cells extending in a first horizontal direction and columns of memory cells extending in a second horizontal direction orthogonal to the first horizontal direction.

* * * * *

UNITED STATES PATENT AND TRADEMARK OFFICE
CERTIFICATE OF CORRECTION

PATENT NO. : 10,847,512 B2  
APPLICATION NO. : 16/748269  
DATED : November 24, 2020  
INVENTOR(S) : Sills et al.

It is certified that error appears in the above-identified patent and that said Letters Patent is hereby corrected as shown below:

In the Specification  
        Column 1,    Line 51,    change "capacitor," to --capacitor.--  
        Column 8,    Line 32,    change "ITT" to --TFT--

In the Claims  
    Claim 4,    Column 22,    Line 40,    delete "further"

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*